310-322 SR
1/11/83 OR 4,368,400

United States Patent [19]

Taniguchi et al.

[11] 4,368,400

[45] Jan. 11, 1983

[54] PIEZOELECTRIC ULTRASONIC TRANSDUCER MOUNTED IN A HOUSING

[76] Inventors: Yoshiharu Taniguchi; Masanori Akiyama; Osamu Kinoshita, all of 380-1, Yasunaga Hotta, Tottori-shi, Tottori 680, Japan

[21] Appl. No.: 232,042

[22] PCT Filed: May 14, 1980

[86] PCT No.: PCT/JP80/00104

§ 371 Date: Jan. 15, 1981

§ 102(e) Date: Jan. 14, 1981

[30] Foreign Application Priority Data

May 15, 1979 [JP] Japan ............................... 54/060015

[51] Int. Cl.[3] ............................................ H01L 41/08

[52] U.S. Cl. ............................... 310/322; 179/110 A; 310/326; 310/345

[58] Field of Search ............... 310/322, 324, 345, 326, 310/365, 366, 367, 368, 321; 179/110 A

[56] References Cited

U.S. PATENT DOCUMENTS 3,675,053 7/1972 Mifune et al. ........................ 310/322
3,749,854 7/1973 Mifune et al. .................. 310/322 X
4,052,627 10/1977 Hayakawa et al. ................ 310/322
4,283,649 8/1981 Heinouchi ........................ 310/322 X

FOREIGN PATENT DOCUMENTS 49-95942 8/1974 Japan .
51-39073 4/1976 Japan .

*Primary Examiner*—Mark O. Budd
*Attorney, Agent, or Firm*—Irving M. Weiner; Pamela S. Burt; John L. Shortley

[57] ABSTRACT

An ultrasonic transducer comprises a vibrating assembly having a thickness-poled piezoelectric ceramic disk (12) bonded concentrically to a resonant plate (13) of greater diameter than that of the ceramic disk (12), which having a radiator (30) is set in the center of the resonant plate (13) on the opposite surface to the ceramic disk (12), and which fitted onto a plastic baseplate (51) using such adhesive (52) as will retain elasticity after curing and accommodated within a housing (80) with a director (81) on top.

The ultrasonic transducer has superior performance to conventional bimorph devices by 6 dB in terms of receiving sensitivity.

1 Claim, 16 Drawing Figures

PIEZOELECTRIC ULTRASONIC TRANSDUCER MOUNTED IN A HOUSING

DETAILED DESCRIPTION OF THE INVENTION

This invention is related to ultrasonic transducer. Conventionally, there are available many kinds of transducers used at ultrasonic range, most of which are composed of joined two (2) pieces of ceramic plates, or consist of sandwiched one plate and they are inferior to our newly invented transducers by 6 dB in receiving sensitivity.

Particularly, our newly invented transducers show better performance than the conventional units of the type of bimorph remarkably at a range of center frequency, saying, 20 KHz to 38 KHz.

Hereunder, we explain the contents of our invention with reference to the accompanying drawings. We had many tests related to the center frequency and we take here 25 KHz as the center frequency and describe it.

The most essential part of the transducer embodying the present invention is the vibrating assembly which includes the vibrator proper consisting of a piezoelectric ceramic element bonded concentrically to a resonant plate for the purpose of the present disclosure is conveniently metal aluminum in material, since it can most easily be given form in processing, and is circular-shaped with a radiator positioning seat at the center. Selection of other material than metal aluminum depends on given conditions in designing, that is, permanent elasticity steel like semi-melt aluminum oxide or Nispan may be employed when further stability in temperature characteristic is desired.

DESCRIPTION OF THE DRAWINGS

The invention will be better understood from the following description taken in connection with the accompanying drawings in which.

3*a* is a conventional structure;

3*b* is a typical structure embodying the invention; and

Figure 3A:
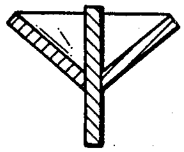
FIGS. 3*a*, 3*b* and 3*c* are vertical sectional views of radiators where.
Figure 3B:
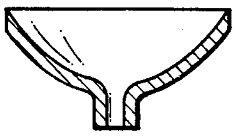
Figure 3C:
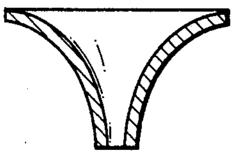
Figure 4:
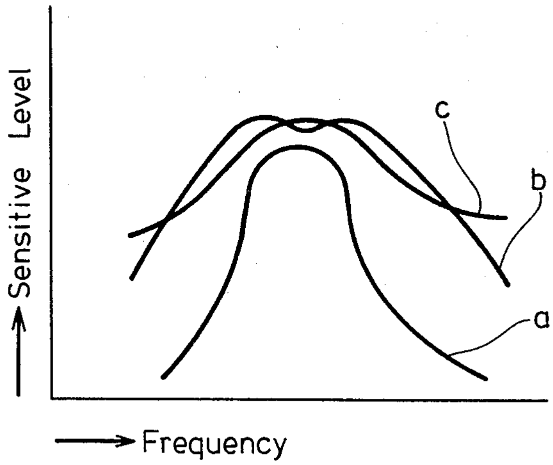
Figure 5A:
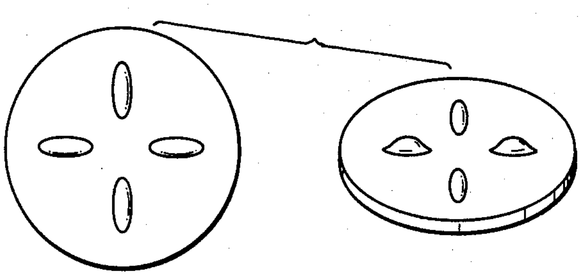
Figure 5B:
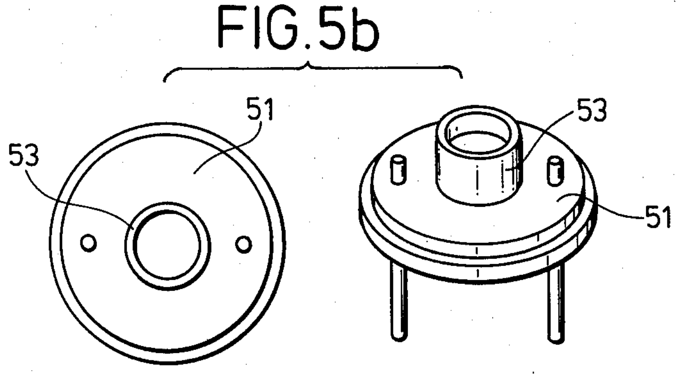
Figure 5C:
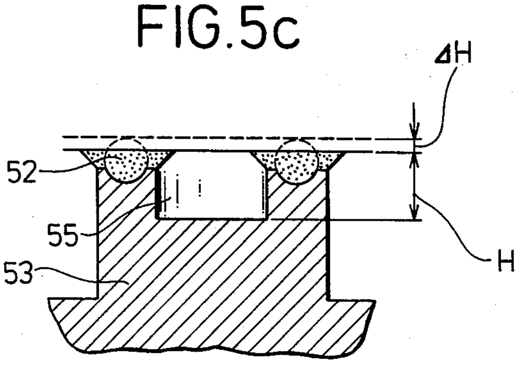

3*c* is an alternate structure embodying the invention;

FIG. 4 illustrates electrical characteristics of radiators, curves a, b and c corresponding to those in FIG. 3;

FIGS. 5*a*, 5*b* and 5*c* are views of baseplate where:

5*a* is a front and a perspective views of a conventional baseplate: and

Figure 6:
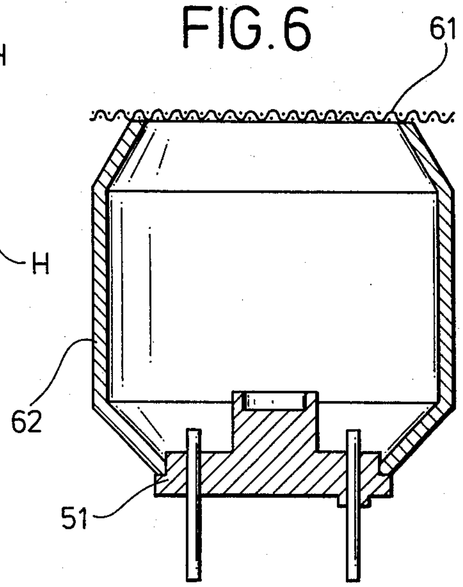
Figure 7:
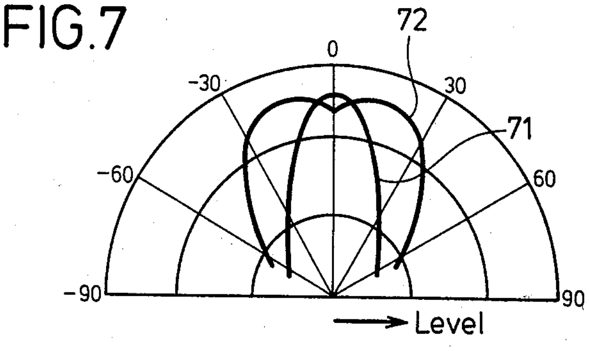
Figure 8A:
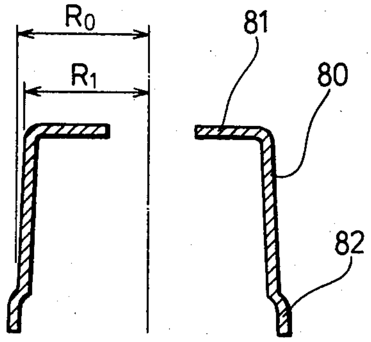
Figure 8B:
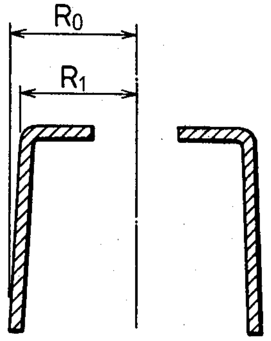
Figure 9A:
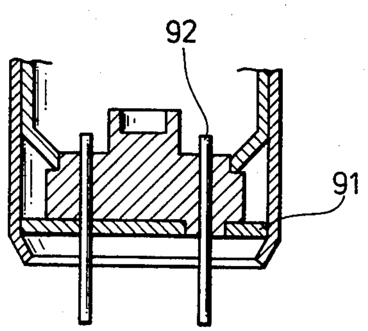
Figure 9B:
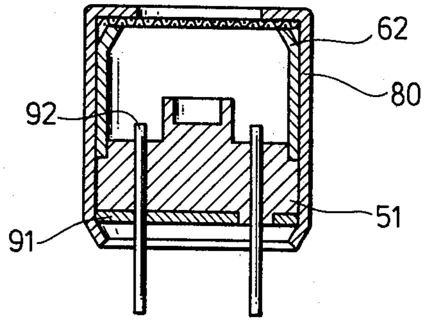
Figure 10A:
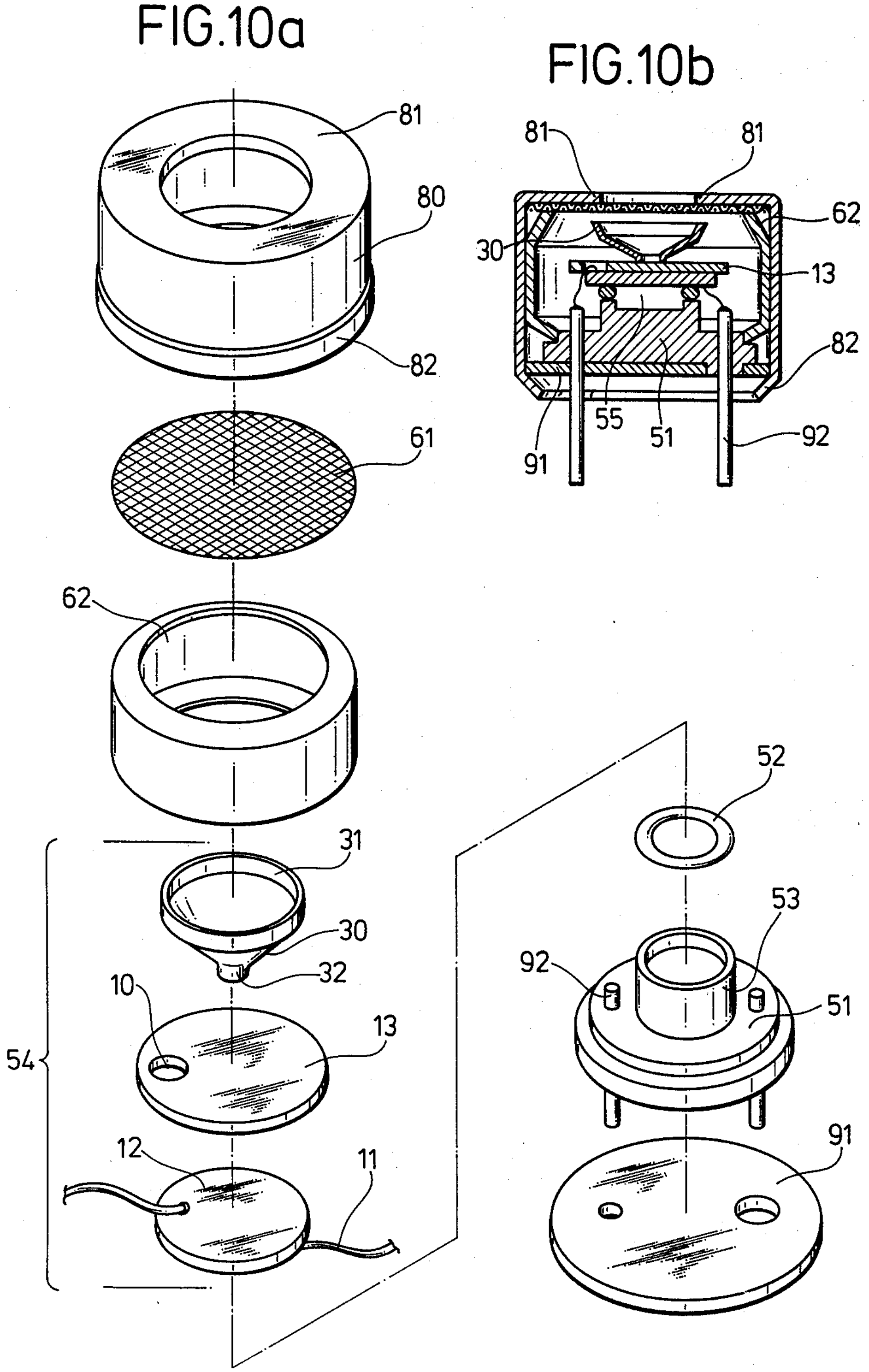

5*b* and 5*c* are a front, a perspective and a partially sectional views of the baseplate embodying the invention;

FIG. 6 is a longitudinal section view of the holding member together with the metal grill and the baseplate embodying the invention;

FIG. 7 illustrates pattern directivity according to the invention (curve 72) in comparison with a conventional one (curve 71);

FIGS. 8*a* and 8*b* are longitudinal sectional views of the typical housing shapes embodying the invention illustrating a taper thereto;

FIGS. 9*a* and 9*b* are partially sectional views of the soleplate embodying the invention illustrating variation in its application depending on diametral requirements of the housing;

FIGS. 10*a* and 10*b* are, respectively, an exploded pictorial view and a sectional elevated view of the transducer embodying the invention.

Figure 1:
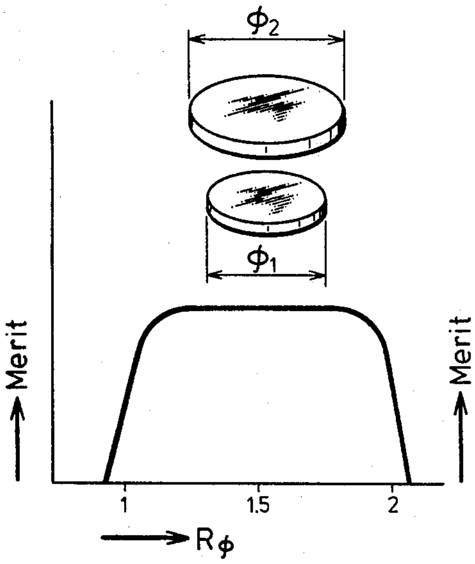
FIGS. 1 and 2 illustrate overall merit of the vibrator proper in relation to ratios of diameter and thickness of the resonant plate to those of the ceramic element.

With regard to the diametral ratio of the resonant plate to the ceramic element, FIG. 1 should be referred to, where on the X-abcissa is the ratio $R\phi=\phi2/\phi1$, $\phi1$ being the diameter of ceramic element and $\phi2$ that of resonant plate, and on the Y-abcissa is the overall merit of the transducer from the view points of both manufacturing process and electroacoustic performance. Where $R\phi<1$, i.e. diameter of resonant plate ($\phi2$) being less than that of ceramic element ($\phi1$), the latter needs to be manufactured dimensionally large if lower resonant frequencies are desired of the resonant plate. This apparently is against the current trend for smaller sized electronic parts, and decreases its overall merit on account of loss in marketability.

On the other hand, where $R\phi>2$, i.e. the diameter or resonant plate ($\phi2$) being greater than twice that of ceramic element ($\phi1$), acoustic characteristic of the transducer is materially detracted since a dimensionally large resonant plate to be excited overloads the exciting ceramic element. Therefore, the diametral ratio of the resonant plate to the ceramic element, where $1<R\phi>2$, is suitable for embodying the present invention.

Figure 2:
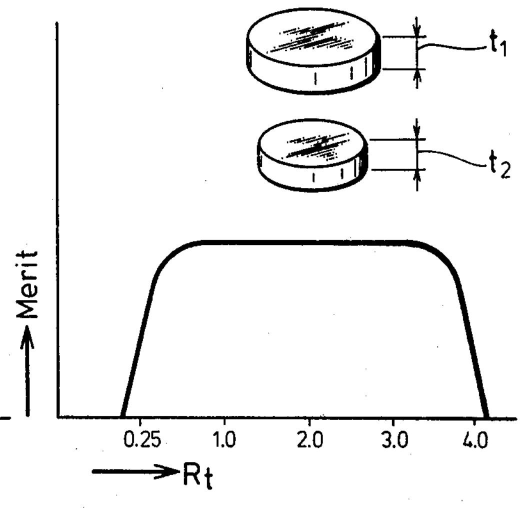

With regard to the thickness ratio of the resonant plate to the ceramic element, FIG. 2 should be referred to, where on the X-abscissa is the ratio $Rt=t2/t1$, t1 being the thickness of ceramic element and t2 that of resonant plate, and on the Y-abscissa is the overall merit of the transducer. Where $Rt<0.25$, i.e. the thickness of resonant plate (t2) being less than one-quarter of that of ceramic element (t1), decrease in resonant plate thickness locally causes abnormal vibrations resulting in spurious resonant phenomena to such degree as are unfit for the purpose of the present invention.

On the other hand, where $Rt>4.00$, i.e. the thickness of resonant plate (t2) being more than four times greater than that of the ceramic element (t1), decrease in ceramic element thickness makes difficult its pressure forming without product variation. Furthermore, since large input of electric energy may not be supplied to extremely thin ceramic element, use of transducer as transmitter becomes restricted, although the ratio may be $Rt>5.00$ when used as receiver. In either case, mechanical strength decreases inevitably. Therefore, the thickness ratio of the resonant plate to the ceramic element, where $0.25<Rt>4.00$, is suitable for embodying the invention when a transducer is used for transmitting, and also where $0.25<Rt>5.00$, is suitable for receiving. Conventional right cone radiators of funnel-like appendant type as shown in FIG. 3*a* have not been successful in satisfying market's demand for multi-channel signals, owing to their limited operating frequency range and to low sensitivity level as shown by the characteristic curve a, FIG. 4. The novel transducer embodies a radiator to meet the market's demand for wider frequency range. Extensive researches on various radiator shapes have revealed that a radiator eliminates inside reflection of vibrations when the aperture edge 31 is of a knife-edge or sharpe bevel edge like 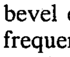; that a radiator has wider operating frequency range when the vertical section is similar to that of a cathode-ray tube as shown in FIG. 3*b*, rather than of a right cone; and that a radiator has higher sensitivity characteristic when the vertical section is similar to that of a trumpet as shown in FIG. 3*c*. Superior electrical characteristics of the novel types as compared with a conventional one are illustrated in FIG. 4, curves a, b and c corresponding to the respective three types in FIG. 3.

The baseplate 51 is electrically insulated and holds the vibrating assembly 54. Referring to FIG. 5*a*, there is shown a conventional baseplate having several projecting lumps in radial pattern on an insulated plate. This method of holding has proved incapable of precluding mechanical percussion of the vibrating assembly against a part of such baseplate, and thus responsible at this stage for characteristic detract or product variation. As shown in FIG. 5*b*, the novel transducer introduces the baseplate 51 of insulated material provided with adhesive mount 53 consisting of an integral forward protrusion of the baseplate into a solid cylinder form. The cylindrical portion is internally cut from the top into a cylindrical cavity so as to leave a circumferential wall of a certain height.

Diameter of the wall portion of the adhesive mount 53 is approximately the same as that of the annular node of the vibrator proper, and is grooved at the wall top where sufficient amount of adhesive 52 is to be uniformly filled. The vibrating assembly 54, after thus affixed onto the mount 53, may be held secured by means of a jig or a clamp until complete cure is reached of such ever-elastic adhesive as silicon compound rubber. Referring to FIG. 5, there is shown air chamber 55 as encompassed by the bottom surface of the vibrating assembly 54, ring-shaped adhesive 52 and the side and bottom walls of adhesive mount 53. The air chamber thus provided has been proved to be capable of precluding mechanical percussion of the fitted assembly 54 against the adhesive mount 53. More precisely and referring to FIG. 5*a*, final height H of the air chamber 55 has been proved satisfactory over the range of 0.3 mm to 3.0 mm inclusive for the purpose of the invention, taking into account the influence of initial height $H+\Delta H$ where $\Delta H$ represents that portion of the adhesive to be sunk by the mounting of the vibrating assembly thereto. Final height H is determined in consideration of the quantity as well as the quality of the adhesive utilized.

The holding member: stopper 62 with reference to FIG. 6 is not of a straight cylinder of shape but has an inward bent at an angle at the top periphery operative to uphold a 60-mesh metal grill 61, and another inward bent at the bottom periphery also upholding the shoulder portion of the baseplate 51 together with soleplate 91 thereunder. The two inward bents have further function of yielding higher resonant chamber effect within.

Ultrasonic waves are known to accord a transducer wider directivity angles than other radiations such as infrared devices. This feature has not been made most use of in housing design of conventional embodiments of transducers in which, owing to relatively low level of own characteristic, so much significance has been attached to the level value around the zero axis, that the area of application has naturally been limited.

The novel transducer, which is a result of further improvements on the inventors' prior Unility Model No. 1970-16578 under the Utility Model Act of Japan, is of such high characteristic level as enables use of a reflecting body as radiation director 81 without significantly sacrificing radiation energy around the zero axis and yet with resulting beam extending to a half value angle of 40 degrees. FIG. 7 illustrates broadened radiation characteristics curve 72 according to the invention in comparison with conventional characteristics cirve 71.

Referring to FIG. 8*b*, there is shown a longitudinal sectional view of the housing embodying the invention. In conventional design of a housing, diametric ratio of the housing bottom to the top aperture is not greater than between 1:0.75 and 1:0.90. Reducing the ratio below 0.75 would mean implementation thereto of a director 81 as in the present invention. More precisely, an arbitrary ratio of 0.63 applied to a housing of 24.00 mm diameter will yield an aperture diameter of 15.12 mm ($24.00\times0.63=15.12$), whereas the same housing of 24.00 mm diameter at the ratio of 0.75 will yield an aperture diameter of 18.00 mm ($24.00\times0.75=18.00$). This means implementation to the housing 80 of a director 81 with outer diameter of 18.00 mm and inner aperture diameter of 15.12 mm. Further to FIG. 8*b*, there is shown a tapered housing by making outer top diameter R1 slightly smaller than outer bottom diameter Ro. The objective of a taper is to facilitate insertion of the inside commonality with resultant stability afterwards. The housing may have an integral outward extension 82 as shown in FIG. 8*a* so as to precisely position transducer in applied devices, with fractionally increased production costs but without material deviation to the electrical characteristic of the transducer.

FIG. 9*a* illustrates mode of clinching around the bottom of the housing against a metal soleplate 91 to which is soldered one of the electrical terminals 92 provided on the insulated baseplate 51. An alternative mode of embodiment is possible as shown in FIG. 9*b* when smaller diameter housing is utilized.

The above description of the invention will be more fully understood from the following detailed description giving actual value on an ultrasonic transducer with range frequency of 25 to 27 KHz.

A ceramic element 12 is made from composite in which pb (Zr 0.525+Ti 0.475) $O_3$ is main oxide with $Li_2O$ added thereto, by means of basic process of molding ceramic element, into a disk of 0.5 mm diameter and 0.3 mm thickness. The disk is electrode-silvered on both front and rear surfaces, and then is supplied with 1,800 DC voltage for thickness-polarization, and is finally provided with two lead wires: one soldered near the periphery of the front surface and the other centro-symmetrically on the back.

A resonant plate 13 is made of metal aluminum with 0.3 mm thickness and 12.5 mm diameter and is provided with a hollow to allow a lump of soldered connection between one lead wire and one surface of the ceramic disk.

A radiator 30 has sectional view pattern of a cathode-ray tube without front screen portion and is 10.5 mm in diameter.

The vibrating assembly consisting of the above three items is fitted onto adhesive mount 53 on 17 mm diameter insulated baseplate 51 using such adhesive as will sufficiently retain elasticity after curing. Two lead wires 11 are now connected and soldered to respective electrical terminals 92 provided on the baseplate 51, and then coated with silicon compound rubber adhesive at the proximity of the solderings so as to preclude spurious vibrations.

A holding member 62 is made to 15 mm in length, 22.5 mm in body diameter and 21.0 mm in top aperture diameter, while at the foot the aperture diameter is 16.5 mm so as to secure the baseplate 51.

The housing has 0.1 mm of a taper from 23.8 mm foot diameter to 23.6 mm head diameter via 23.7 mm body diameter. Aperture diameter of field radiation pattern director 81 is 15. 0 mm for the purpose of the invention, but in case higher level at center axis than at off-axis is desired as with conventional types, aperture diameter needs to be set at 19.5 mm.

A 60 mesh metal grill, punched into a 22.3 mm diameter disk 61, is inserted from inside of the housing 80 and is up-held by holding member 62 from underneath. The holding member 62 also up-holds the shoulder portion of the insulated baseplate 51. A soleplate 91 with two terminal openings is then laid at the bottom, to which is soldered one of the electric terminals for completing electromagnetic shield system of the transducer. Bottom periphery of the housing 82 is fanally clinched as shown in FIG. 9*b.*

Referring now to FIGS. 10*a* and 10*b,* there is shown a typical embodiment of the transducer according to the invention.

It is understood, despite all of the foregoing descriptions, that the shape of vibrating assembly needs not necessarily to be of a cycle, but could be polygonal, over or elliptical. The particular shapes may be preferred and utilized without loss to the high sensitivity of the novel transducer in accordance with industrial demands for varied applications including detecting, sensing and wireless communication.

We claim:

1. An ultrasonic transducer comprises:

a vibrating assembly:

a piezoelectric ceramic element, a metal resonant plate engaging one surface of the ceramic element, a radiator affixed to said resonant plate, and two lead wires connected to said piezoelectric element, coated with silicon compound adhesive at the proximity of soldering onto the electrode surfaces of the ceramic element so as to preclude spurious vibrations and comprises:

a baseplate having two electrical terminals: first electrical terminal connected to the lead wire from the front electrode surface of the ceramic element and second electric terminal connected to the lead wire from the front electrode surface of the ceramic element, an adhesive mount provided on the baseplate, whose circumperential wall has a diameter approximately coinciding with that of the node of the vibrator proper, an air chamber encompassed by the bottom surface of the said vibrating assembly, ring-shaped adhesive as will retain sufficient elasticity elasticity after curing and the side and bottom walls of said adhesive mount, a metal soleplate, a meshed metal grill, a non-cylindrical holding member: stopper, a housing which is slightly tapered and includes a field radiation pattern director.

* * * * *

UNITED STATES PATENT AND TRADEMARK OFFICE

CERTIFICATE OF CORRECTION

PATENT NO. : 4,368,400

DATED : January 11, 1983

INVENTOR(S) : Yoshiharu TANIGUCHI et al

It is certified that error appears in the above-identified patent and that said Letters Patent are hereby corrected as shown below:

Column 6, line 15, change "front" to --back--.

Signed and Sealed this

*Thirteenth* Day of *August 1985*

[SEAL]

*Attest:*

DONALD J. QUIGG

*Attesting Officer* *Acting Commissioner of Patents and Trademarks*